(12) United States Patent
Li et al.

(10) Patent No.: US 10,559,253 B1
(45) Date of Patent: Feb. 11, 2020

(54) DISPLAY PANEL AND DISPLAY DEVICE

(71) Applicant: Wuhan Tianma Micro-Electronics Co., Ltd., Wuhan (CN)

(72) Inventors: Bo Li, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/237,900

(22) Filed: Jan. 2, 2019

(30) Foreign Application Priority Data

Sep. 30, 2018 (CN) .......................... 2018 1 1156452

(51) Int. Cl.
*G09G 3/3225* (2016.01)
*H01L 27/12* (2006.01)
*H01L 27/32* (2006.01)

(52) U.S. Cl.
CPC ......... *G09G 3/3225* (2013.01); *H01L 27/124* (2013.01); *H01L 27/3276* (2013.01); *G09G 2310/0264* (2013.01)

(58) Field of Classification Search
CPC ............ G09G 3/3225; G09G 2310/026; H01L 27/3276; H01L 27/124
See application file for complete search history.

(56) References Cited

U.S. PATENT DOCUMENTS 10,367,052 B2 * 7/2019 Zhang ................. H01L 27/3276
2018/0342194 A1 * 11/2018 Li ......................... G09G 3/2092

FOREIGN PATENT DOCUMENTS

CN 107749287 A 3/2018

* cited by examiner

*Primary Examiner* — Abhishek Sarma
(74) *Attorney, Agent, or Firm* — Anova Law Group PLLC

(57) ABSTRACT

A display panel and a display device are provided. The display panel includes a display region having a first edge; a non-display region surrounding the display region; a notch; a plurality of display pixels; a plurality of signal lines; a plurality of first compensation lines in the non-display region; and a potential line in the non-display region providing a fixed potential. The display region includes a first display region and a second display region at two sides of the notch along a first direction. The plurality of signal lines includes first signal lines and second signal lines which are not electrically connected to each other. The plurality of first compensation lines is electrically connected to the first signal lines. The plurality of first compensation lines is disposed in a different metal layer from the potential line and at least partially overlaps with the potential line to form compensation capacitors.

20 Claims, 17 Drawing Sheets

DISPLAY PANEL AND DISPLAY DEVICE

CROSS-REFERENCES TO RELATED APPLICATION

This application claims the priority of Chinese Patent Application No. 201811156452.3, filed on Sep. 30, 2018, the content of which is incorporated herein by reference in its entirety.

TECHNICAL FIELD

The present disclosure generally relates to the field of display technology and, more particularly, relates to a display panel and a display device.

BACKGROUND

As technologies develop for display panels, more demands are focused on a border width of the display panels. For a display panel with an overall size fixed, the narrower the border is, the larger the area of a display region can be, so as to achieve display effect by a narrow-border display panel or even a borderless display panel.

To improve a screen ratio of a display panel, a notch structure is formed in the display panel. Functional modules such as cameras and earpieces are then disposed in the notch instead of being disposed in the border region, to reduce the width of the border.

Because of use of the notch, each signal line in the display panel for transmitting driving signals to display pixels is connected to a different number of display pixels. Consequently, signal lines have different capacitive loads, thereby easily causing uneven display problems.

There is a need to provide a display panel and a display device with a desirable display uniformity. The disclosed display panel and display device are directed to solve one or more problems set forth above and other problems in the art.

SUMMARY

One aspect of the present disclosure provides a display panel. The display panel comprises: a display region having a first edge; a non-display region surrounding the display region; a plurality of display pixels including a first and second plurality of display pixels, in the display region; a plurality of signal lines for transmitting driving signals to the plurality of display pixels; a plurality of first compensation lines in the non-display region; and a potential line in the non-display region for providing a fixed potential. The plurality of signal lines and the first edge of the display region extend along a first direction. The first edge recesses toward an inside of the display region to form a notch. The display region includes a first display region and a second display region separated by the notch along the first direction. The plurality of signal lines includes first signal lines for transmitting the driving signals to the first plurality of display pixels in the first display region and second signal lines for transmitting the driving signals to the second plurality of display pixels in the second display region. The first signal lines are not electrically connected to the second signal lines. The plurality of first compensation lines is electrically connected to the first signal lines. The potential line and the plurality of first compensation lines are disposed in different metal layers respectively; and each of the plurality of first compensation lines at least partially overlaps with the potential line to form a compensation capacitor.

Another aspect of the present disclosure provides a display device. The display device includes a display panel. The display panel includes: a display region with a first edge; a non-display region surrounding the display region; a notch; a plurality of display pixels; a plurality of signal lines; a plurality of first compensation lines in the non-display region; and a potential line in the non-display region providing a fixed potential. The display region includes a first display region and a second display region at two sides of the notch along a first direction. The plurality of signal lines includes first signal lines and second signal lines which are not electrically connected to each other. The plurality of first compensation lines is electrically connected to the first signal lines. The plurality of first compensation lines is disposed in a different metal layer from the potential line and at least partially overlaps with the potential line to form compensation capacitors.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
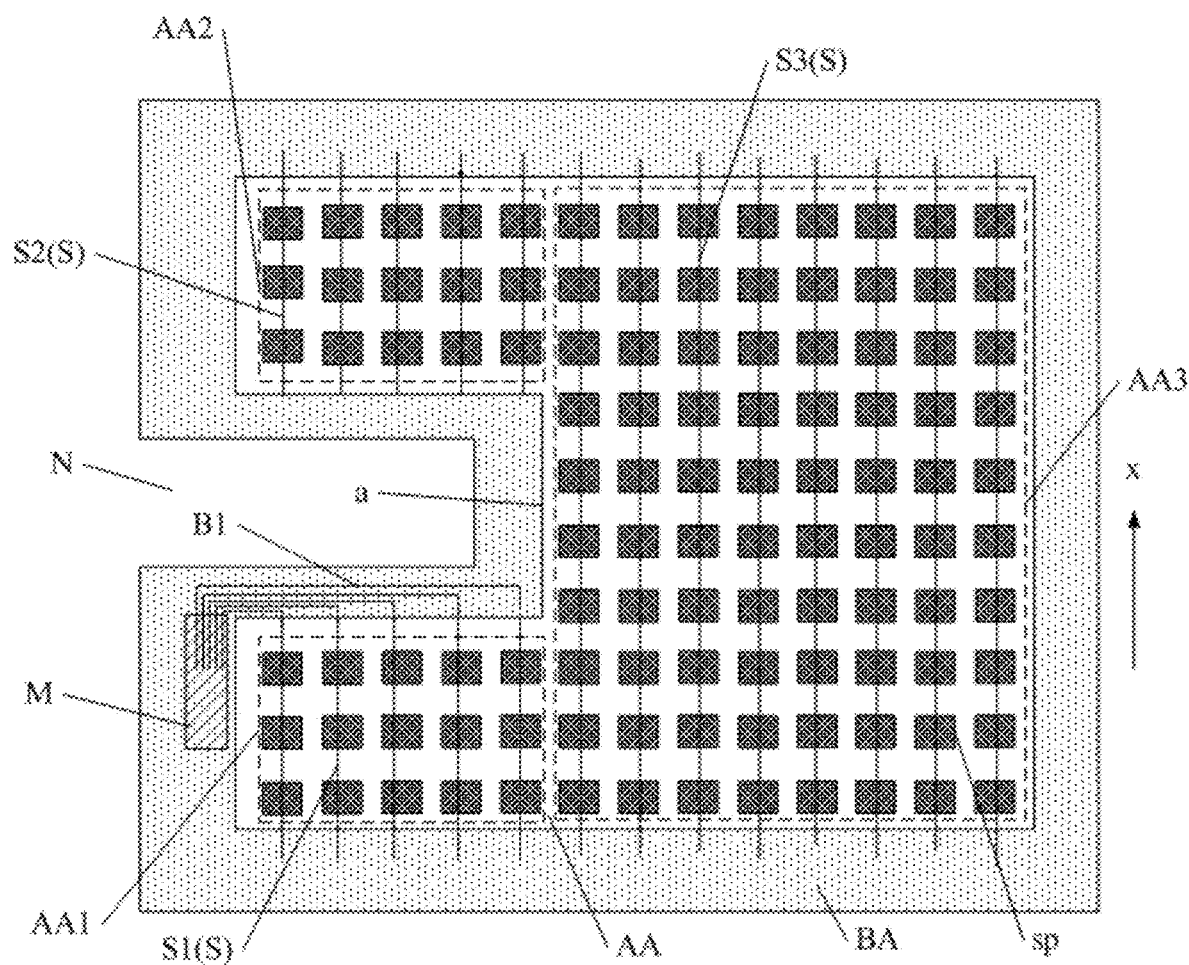
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the invention. Furthermore, a three-dimensional (3D) size including ength, width and depth should be considered during practical fabrication The present disclosure provides a display panel and a display device. panel includes a display region with a first edge; a non-display region surrounding the display region; a notch; a plurality of display pixels; a plurality of signal lines; a plurality of first compensation lines in the non-display region; and a potential line in the non-display region providing a fixed potential. The display region includes a first display region and a second display region at two sides of the notch along a first direction. The plurality of signal lines includes first signal lines and second signal lines which are not electrically connected to each other. The plurality of first compensation lines is electrically connected to the first signal lines. The plurality of first compensation lines is disposed in a different metal layer from the potential line and at least partially overlaps with the potential line to form compensation capacitors. A display uniformity of the display panel is improved.

FIG. 1 illustrates an exemplary display panel consistent with various disclosed embodiments in the present disclosure. The display panel may include a display region AA, a non-display region BA surrounding the display region AA, and a notch N. The display region AA may have a first edge a.

The display panel may further include a plurality of display pixels sp and a plurality of signal lines S which transmit driving signals to the plurality of display pixels sp. The plurality of signal lines S and the first edge a may extend along a first direction x. The first edge a may be recessed toward an inside of the display region AA to form the notch N.

The display region AA may include a first display region AA1 and a second display region AA2 on two sides of the notch N along the first direction x. The plurality of display pixels sp may include a first plurality of display pixels in the first display region AA1 and a second plurality of display pixels in the second display region AA2. The plurality of signal lines S may include first signal lines S1 for transmitting driving signals to the first plurality of display pixels in the first display region AA1, and second signal lines S2 for transmitting driving signals to the second plurality of display pixels in the second display region AA2. The first signal lines S1 and the second signal lines S2 may be not connected to each other. Correspondingly, the first signal lines S1 and the second signal lines S2 may receive the driving signals independently.

The display panel may further include a plurality of first compensation lines B1 in the non-display region BA. The plurality of first compensation lines B1 may be electrically connected to the first signal lines S.

The non-display region BA may include a potential line M to provide a fixed potential. The potential line M and the plurality of first compensation lines B1 may be disposed in different metal layers. The potential line M may at least partially overlap with the plurality of first compensation lines B1, to form compensation capacitors.

In one embodiment, the plurality of signal lines S may be data lines or scan lines. An end of one first signal line S1 close to the notch N may be extended to be connected with one of the plurality of first compensation line B1, and another end of the first signal line S1 may be connected to a driving integration circuit chip. The driving integration circuit chip may provide the driving signals to the plurality of signal lines. As illustrated in FIG. 1, in one embodiment, the display region AA may further include a third display region AA3. The plurality of display pixels sp may further include a third plurality of display pixels in the third display region AA3, and the plurality of signal lines S may further include third signal lines S3 for transmitting driving signals to the third plurality of display pixels sp in the third display region AA3. Either end of each third signal lines S3 may be connected to the driving integrated circuit chip. In the display panel illustrated in FIG. 1, the first signal lines S1 may transmit the driving signals to the first plurality of display pixels in the first display region AA1, and the second signal lines S2 may transmit the driving signals to the second plurality of display pixels sp in the second display region AA2. In one embodiment, one end of each third signal line S3 away from the second signal lines S2 may be connected to the driving integrated circuit chip and another end of the third signal line S3 may be connected to one second signal line S2. In other embodiments, one end of each third signal line S3 away from the first signal lines S1 may be connected to the driving integrated circuit chip and another end of the third signal line S3 may be connected to one first signal line S1. When the third signal lines S3 are connected to the second signal lines S2, the second signal lines S2 and the first signal lines S1 may have different capacitive loads because the second signal lines S2 may be not connected to the first signal lines S1. Correspondingly, the second display region AA2 and the first display region AA1 may display unevenly. When the third signal lines S3 are not connected to either the second signal lines S2 or the first signal lines S1, the third display region AA3 and the first display region AA1 may display unevenly, because the third signal lines S3 and the first signal lines S1 may have different capacitive loads. The plurality of first compensation lines B1 and the potential line M may form compensation capacitors, to improve a display uniformity between the third display region AA3 and the first display region AA1. In the present disclosure, the plurality of first compensation lines B1 connected to the first signal lines S1 may be disposed in the display panel. The plurality of first compensation lines B1 and the potential line M providing the fixed potential in the different metal layers, may together form the compensation capacitors. The capacitive loads in the first signal lines S1 may be compensated and an uneven display may be alleviated. Further, the first signal lines S1 may be not connected to the second signal lines S2. Lines in the notch N for connecting the first signal lines S1 to the second signal lines S2 may become unnecessary. A wiring configuration in one side of the notch close to the display region AA may be simplified and a width of the notch at a side close to the display region AA may be reduced.

In the display panel provided by various embodiments of the present disclosure, each of the plurality of first compensation lines electrically connected to the first signal lines may at least partially overlap with the potential line providing the fixed potential in different metal layers, to form a compensation capacitor. Correspondingly, a difference between the capacitive loads of the first signal lines and of other signal lines because of the notch may be compensated, and a display uniformity of the display panel may be improved. When forming the compensation capacitors, the existing potential line providing the fixed potential may be multiplexed. Correspondingly, a width of the border of the display panel may not increase when compensating the signal lines.

In various embodiments of the present disclosure, the potential line M for forming the compensation capacitors with the plurality of first compensation lines B1 may be any one of potential lines that provides a fixed potential to the display panel and can form a potential difference with the plurality of first compensation lines B1. Anyone of potential lines with a fixed potential that is disposed in a different metal layer from the plurality of first compensation lines B1 and capable of forming a potential difference may be used as the potential line M. In various embodiments of the present disclosure, the potential line M may be one of a positive power line for transmitting a positive power signal to the display pixels, a negative power line for transmitting a negative power signal to the display pixels, and a low potential signal line for providing a fixed low potential to a scanning circuit. Since the negative power line for transmitting the negative power signal to the display pixels and the low potential signal line for providing the fixed low potential to the scanning circuit may be disposed in the non-display region and may have low potentials, large compensation capacitors with the plurality first compensation lines may be easily formed. The potential line M for forming the compensation capacitors with the plurality of first compensation lines B1 may be the negative power line for transmitting the negative power signal to the display pixels or the low potential signal line for providing the fixed low potential to the scanning circuit.

Figure 2:
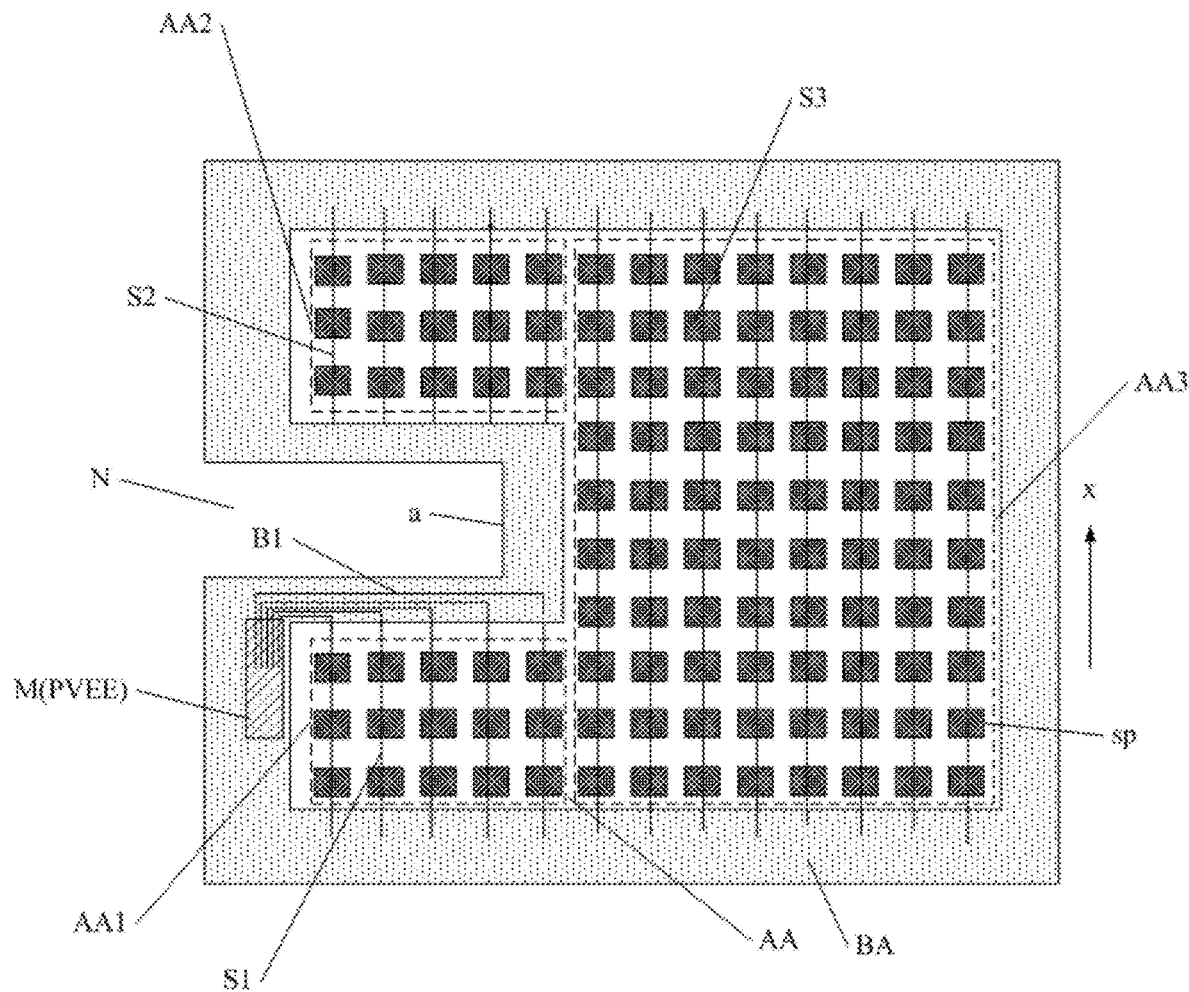
FIG. 2 illustrates another exemplary display panel consistent with various disclosed embodiments in the present disclosure.

In one embodiment of the present disclosure illustrated in FIG. 2, the potential line M may be the negative power line PVEE. The negative power line PVEE may transmit the negative power signal to the plurality of display pixels sp.

In the display panel provided by various embodiments of the present disclosure, the potential line for forming the compensation capacitors with the plurality of first compensation lines may be the negative power line for transmitting the negative power signal to the plurality of display pixels. Large compensation capacitors with the plurality of first compensation lines may be easily formed. Further, the plurality of signal lines in the non-display region may be multiplexed mostly. Existing lines may be multiplexed and a number of lines in the border of the display panel may be reduced. An interference between signals of the lines in the border of the display panel may be avoided and the display uniformity of the display panel may be improved further.

Figure 3:
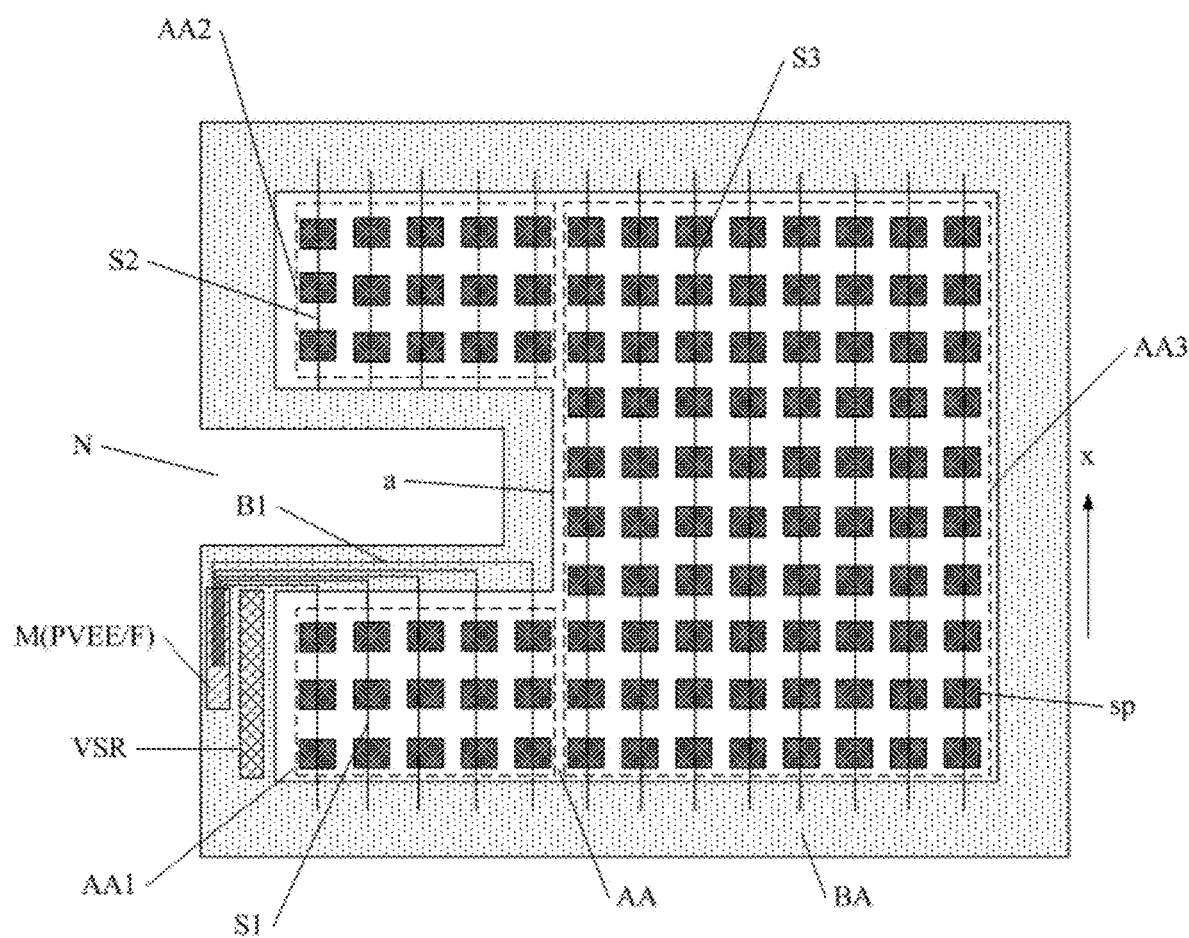
FIG. 3 illustrates another exemplary display panel consistent with various disclosed embodiments in the present disclosure.

In another embodiment illustrated in FIG. 3 where the potential line is the negative power line, the non-display region BA may include a scanning driving circuit VSR and a package metal F. The scanning driving circuit VSR may provide scanning driving signals to drive the plurality of display pixels sp. The package metal F may be disposed at one side of the scanning driving circuit VSR away from the display region AA, and may be multiplexed as the negative power line PVEE.

When compensating the capacitances of the first signal lines S1 in the first display region AA1, one electrode plate of the compensation capacitors may be multiplexed as the package metal F for transmitting the negative power signal. The package metal F may be disposed in a metal layer of an array panel for accommodating source/drain electrodes of thin film transistors. In FIG. 3, the first signal lines S1 may be data lines, and may be disposed in the metal layer accommodating the source/drain electrodes of the thin film transistors. The plurality of first compensation lines B1 may be disposed in a metal layer accommodating gate electrodes of the thin film transistors. A layer-changed punching design may be applied to the first signal lines in the non-display region BA, to connect the plurality of first compensation lines B1 with the first signal lines S1. Correspondingly, the plurality of first compensation lines B1 and the package metal F may be disposed in different metal layers, and overlapping areas between the plurality of first compensation lines B1 and the package metal F may form the compensation capacitors. In other embodiments, the first signal lines S1 in the first display region AA1 may be scanning lines, and may be disposed in the metal layer accommodating the gate electrodes of the thin film transistors. The first signal lines S1 may be extended to form the plurality of first compensation lines B1. Correspondingly, the plurality of first compensation lines B1 and the package metal F may be disposed in different metal layers, and the overlapping areas of the plurality of first compensation lines B1 and the package metal F may form the compensation capacitors. Either one of two ends of each first signal line S1 may be extended. For description purpose only, the embodiment in FIG. 3 is described with an example where one end of each first signal line S1 close to the notch N is extended to form a connection with one of the plurality of first compensation line B1. Correspondingly, the plurality of first compensation lines B1 may bypass the scanning driving circuit VSR easily to form the compensation capacitors with the package metal F.

In the display panel provided by the embodiments of the present disclosure, the package metal may be multiplexed as the negative power line. Correspondingly, the package metal may have at least three functions. The package metal may have a reflecting function as a regular package metal, may transmit the negative power signal since the package metal may be multiplexed as the negative power line, and may be multiplexed as one of the electrode plates of the compensation capacitors since the package metal and the plurality of first compensation lines may together form the compensation capacitors. The package metal may have multiple functions, and resources and spaces may be saved. The scanning driving circuit and the package metal with at least three functions described above may be disposed in the border of the display panel provided by the various embodiments of the present disclosure. Correspondingly, the border of the display panel may be narrow and the display panel with the narrow border may be realized.

Figure 4:
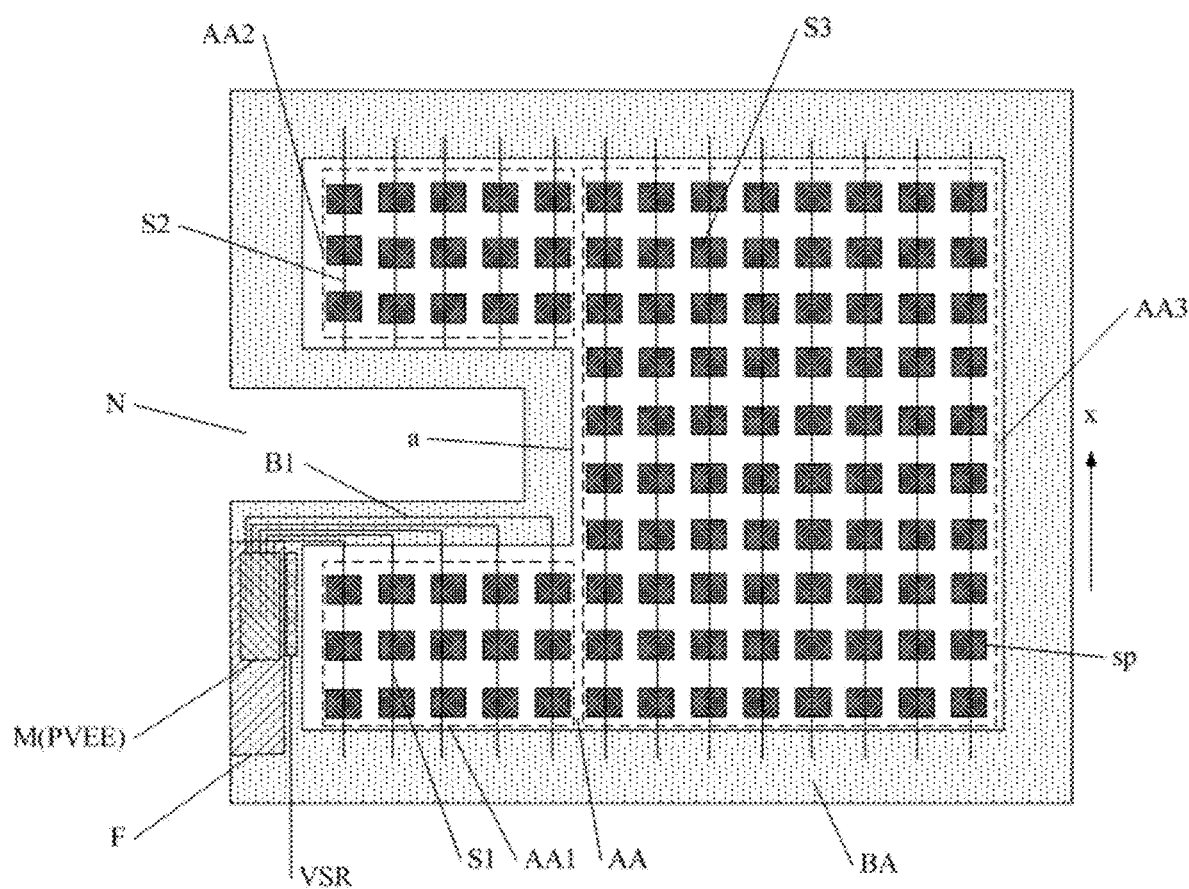
FIG. 4 illustrates another exemplary display panel consistent with various disclosed embodiments in the present disclosure.

In another embodiment illustrated in FIG. 4 where the potential line M is the negative power line PVEE, the non-display region BA may include the scanning driving circuit VSR and the package metal F. The scanning driving circuit VSR may provide the scanning driving signal to drive the plurality of display pixels sp, and may be disposed between the negative power line PVEE and the display region AA. The package metal F may be disposed on a different metal layer from the negative power line PVEE.

The negative power line PVEE may be disposed in a metal layer in an array panel for accommodating source/drain electrodes of thin film transistors so the negative power line PVEE may transmit the negative power signal effectively. In FIG. 4, the first signal lines S1 may be the data lines, and may be disposed in the metal layer accommodating the source/drain electrodes of thin film transistors. The plurality of first compensation lines B1 may be disposed in a metal layer accommodating gate electrodes of thin film transistors. A layer-changed punching design may be applied to the first signal lines S1 in the non-display region BA, to connect the plurality of first compensation lines B1 with the first signal lines S1. Correspondingly, the plurality of first compensation lines B1 and the negative power line PVEE may be disposed in different metal layers, and overlapping areas of the plurality of first compensation lines B1 and the negative power line PVEE may form the compensation capacitors. In other embodiments, the first signal lines S1 in the first display region S1 may be the scan lines, and may be disposed in the metal layer accommodating the gate electrodes of the thin film transistors. The first signal lines S1 may be extended to form the plurality of first compensation lines B1. Correspondingly, the plurality of first compensation lines B1 and the negative power line PVEE may be disposed in different metal layers. The plurality of first compensation lines B1 may overlap with the negative power line PVEE partially or completely to form the compensation capacitors.

In the display panel provided by the embodiments of the present disclosure, the negative power line may be multiplexed as one of the electrode plates of the compensation capacitors, and may be disposed at one side of the scanning driving circuit away from the display region. The package metal and the negative power line may be disposed in different metal layers, and an increase in the width of the border after disposing the negative power line may be avoided since the negative power line may be disposed at one side of the scanning driving circuit away from the display region and may be multiplexed as one of the electrode plates of the compensation capacitors when transmitting the negative power signal. Lines in the border of the display panel may be arranged effectively when realizing the compensation capacitors to the signal lines, and the display panel with the narrow border may be achieved.

Figure 5:
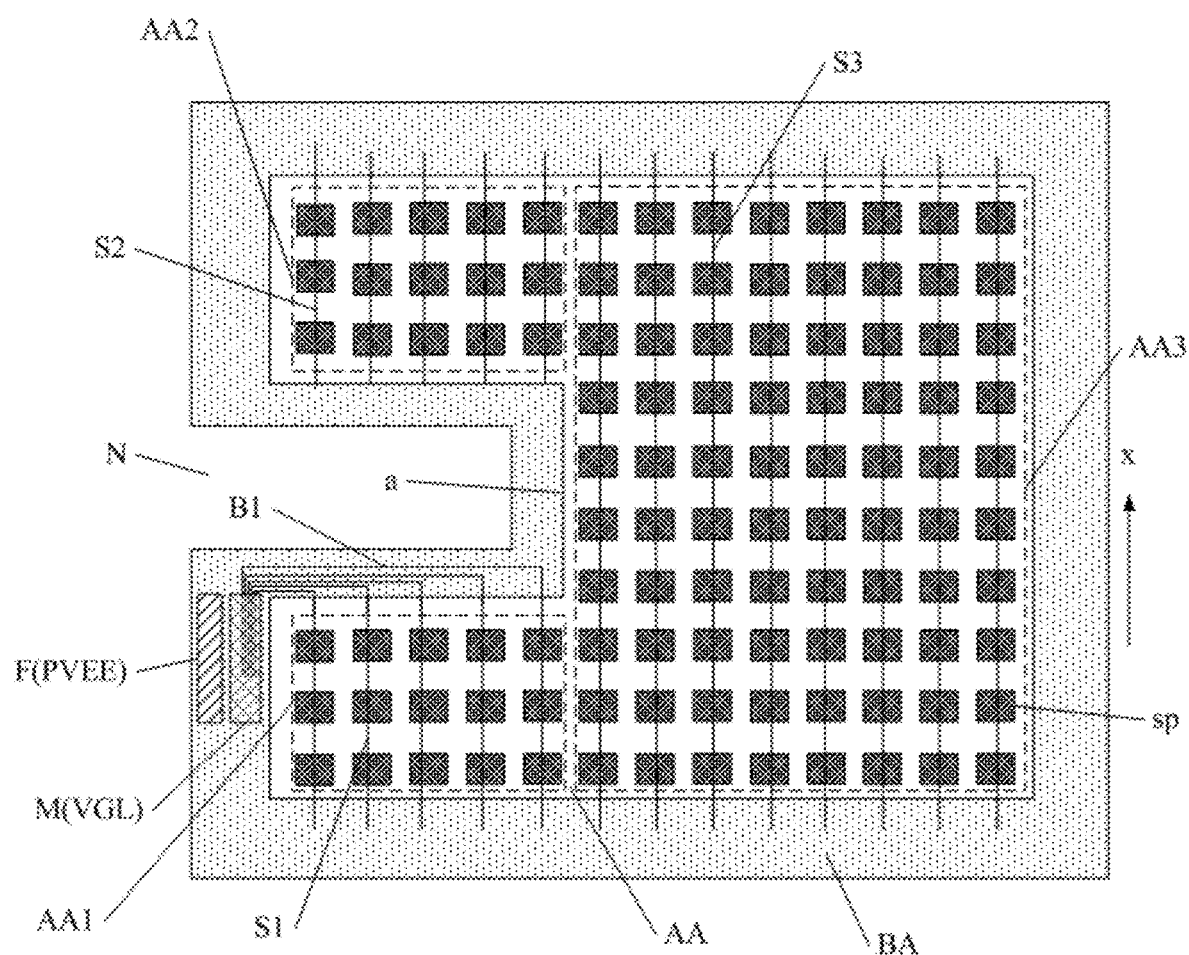
FIG. 5 illustrates another exemplary display panel consistent with various disclosed embodiments in the present disclosure.

In another embodiment illustrated in FIG. 5, the potential line may be the low potential signal line. The non-display region BA may include a scanning driving circuit (not shown in the figures) to provide scanning driving signals to drive the display pixels sp. The potential line M may be the low potential signal line VGL. The low potential signal line VGL may provide the constant low potential to the scanning driving circuit.

The low potential signal line VGL may be disposed in a metal layer of an array panel for accommodating source/drain electrodes of thin film transistors so the low potential signal line VGL may transmit the fixed low potential signal effectively. In FIG. 5, the first signal lines S1 may be the data lines, and may be disposed in the metal layer accommodating the source/drain electrodes of thin film transistors. The plurality of first compensation lines B1 may be disposed in a metal layer accommodating gate electrodes of thin film transistors. A layer-changed punching design may be applied to the first signal lines in the non-display region BA, to connect the plurality of first compensation lines B1 with the first signal lines S1. Correspondingly, the plurality of first compensation lines B1 and the low potential signal line VGL may be disposed in different metal layers, and overlapping areas of the plurality of first compensation lines B1 and the low potential signal line VGL may form the compensation capacitors. In other embodiments, the first signal lines S1 in the first display region AA1 may be the scan lines, and may be disposed in the metal layer accommodating the gate electrodes of the thin film transistors. The first signal lines S1 may be extended to form the plurality of first compensation lines B1. Correspondingly, the plurality of first compensation lines B1 and the low potential signal line VGL may be disposed in different metal layers. The plurality of first compensation lines B1 may overlap with the low potential signal line VGL partially or completely to form the compensation capacitors.

In the display panel provided by various embodiments of the present disclosure, the potential line for forming the compensation capacitors with the plurality of first compensation lines may be the low potential signal line providing the fixed low potential signal to the scanning driving circuit. Large compensation capacitors may be easily formed with the plurality of first compensation lines. Further, signal lines in the non-display region may be multiplexed mostly. A number of lines in the border of the display panel may be reduced, and an interference between signals of the lines in the border of the display panel may be avoided. A display uniformity of the display panel may be improved further.

Figure 6:
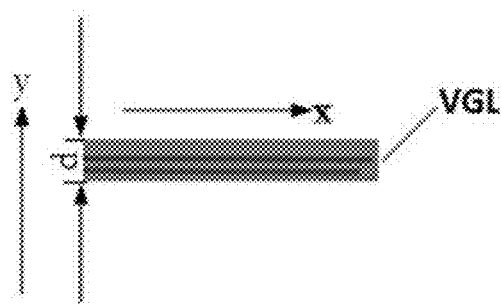
FIG. 6 illustrates a structure of a potential line in an exemplary display panel consistent with various disclosed embodiments in the present disclosure.

In one embodiment where the potential line is the low potential signal line, as illustrated in FIG. 6, the potential line VGL may extend along a first direction x, and may have a width d larger than or equal to 50 μm along a second direction y perpendicular to the first direction x.

When the low potential signal line transmits the low potential signal to the scanning driving circuit, the low potential signal line usually has a width of about 10 μm. To multiplex the low potential signal line as one of the electrode plates of the compensation capacitors and to form the compensation capacitors better, in various embodiments of the present disclosure, the low potential signal line may have a width larger than or equal to 50 μm.

In various embodiments of the present disclosure, the low potential signal line may be multiplexed as one of the electrode plates of the compensation capacitors and the width of the low potential signal line may be increased to make capacitance values of the compensation capacitors meet a compensation requirement.

Figure 7:
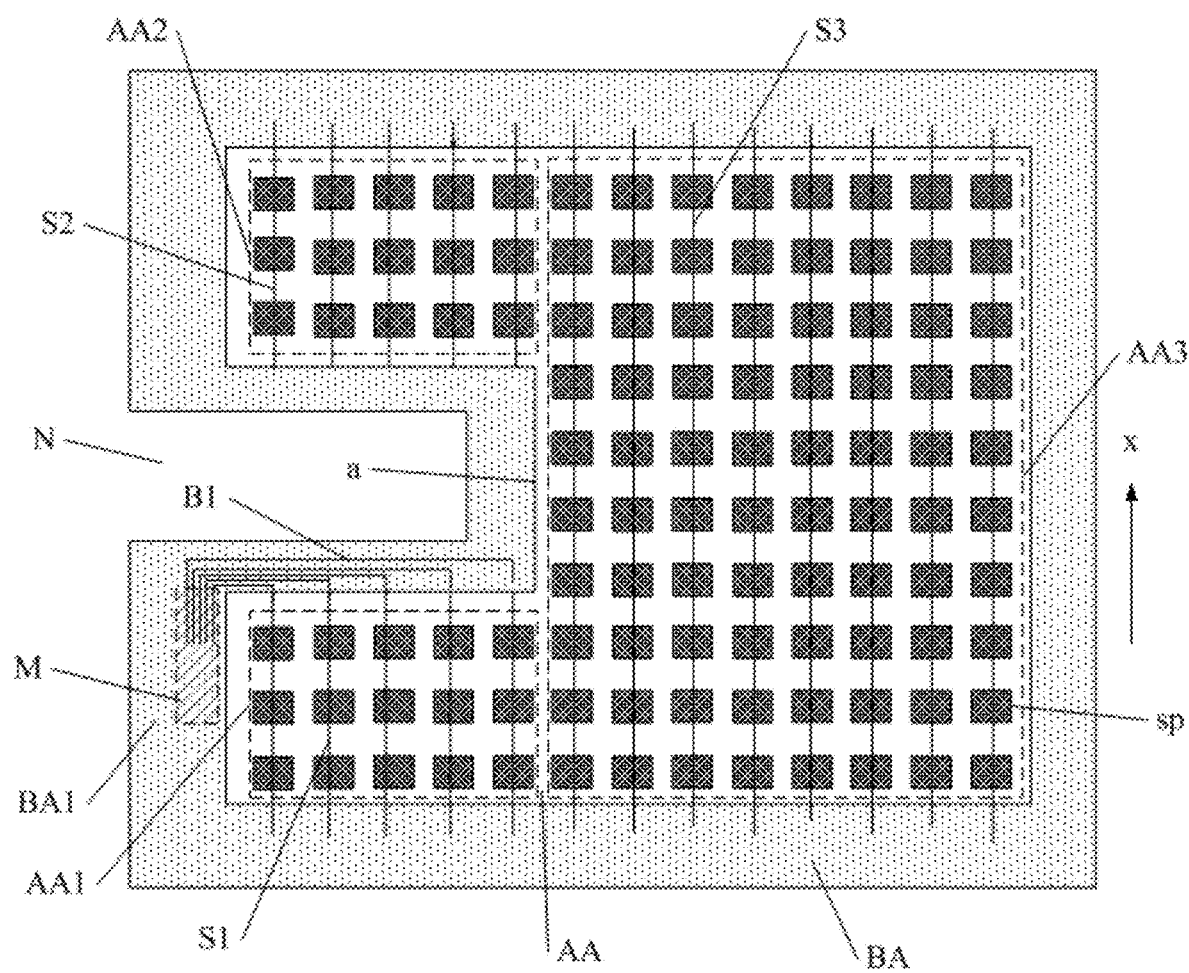
FIG. 7 illustrates another exemplary display panel consistent with various disclosed embodiments in the present disclosure.

In another embodiment of the present disclosure illustrated in FIG. 7, the non-display region BA may include a first non-display region BA1 extending along the first direction x and adjacent to the first display region AA1. The plurality of first compensation lines B1 may overlap with the potential line M at least in the first non-display region BA1, to form the compensation capacitors.

A length of a portion of the plurality of first compensation lines B1 in the first non-display region BA1 may be configured according to the capacitive loads in the plurality of the first signal lines.

In the display panel provided by various embodiments of the present disclosure, the potential line may be disposed in the first non-display region and the plurality of first compensation lines may extend into the first non-display region to form the compensation capacitors with the potential line. The compensation capacitors may be formed inside the first non-display region. The first non-display region may have a longer length along an extending direction of the first non-display region. For example, the length of the first non-display region may be larger than a total length of the plurality of display pixels arranged sequentially. Correspondingly, the potential line extended in the first non-display region may have a long length, and the compensation capacitors with sufficient capacitances may be ensured to be formed inside the first non-display region to meet a compensating requirement on the capacitance values of the compensation capacitors on the first signal lines.

Figure 8:
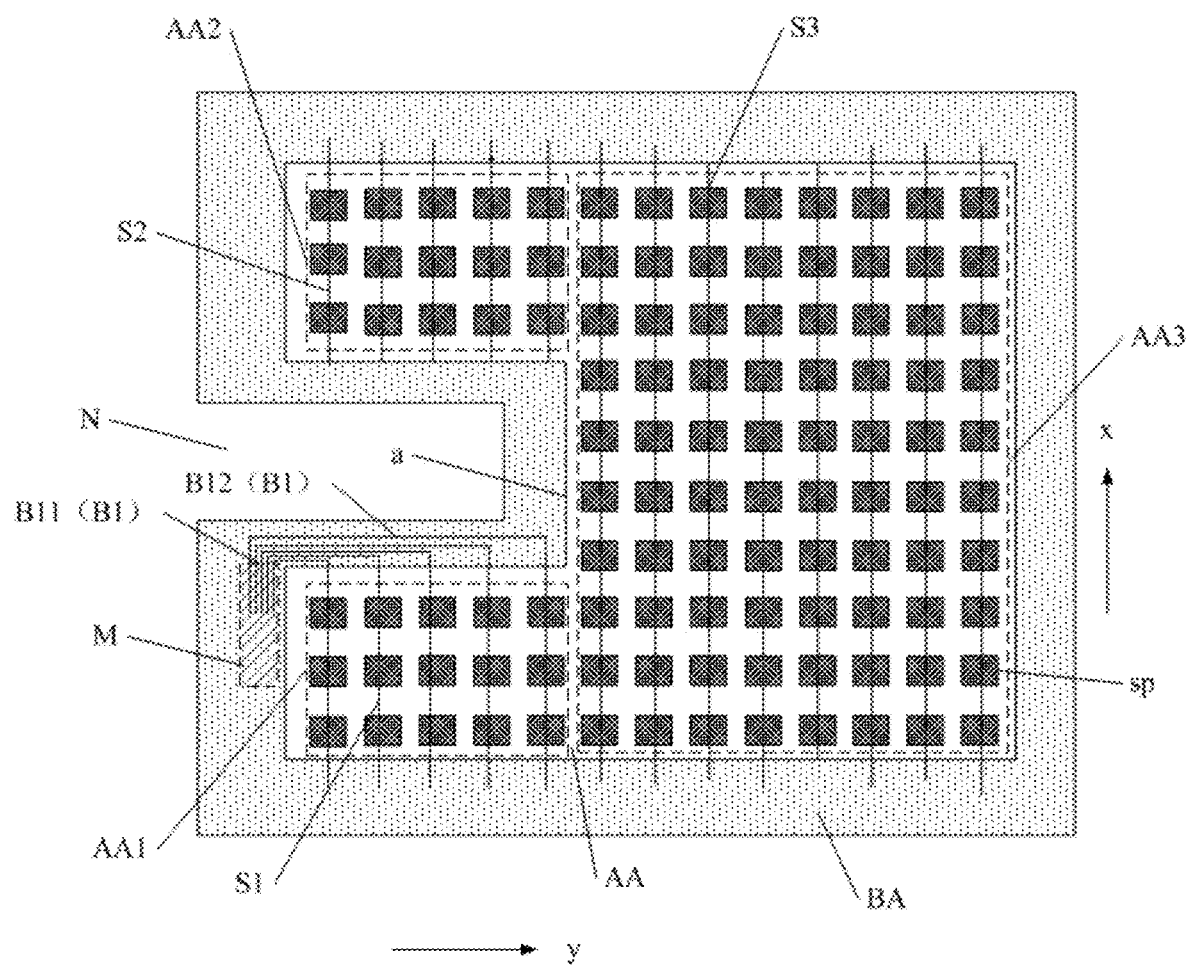
FIG. 8 illustrates another exemplary display panel consistent with various disclosed embodiments in the present disclosure.

In another embodiment of the present disclosure illustrated in FIG. 8, Each of the plurality of first compensation lines B1 may include a first compensation segment B11 extending along the first direction x, and a second compensation segment B12 extending along the second direction y. The first direction x may be perpendicular to the second direction y. The second compensation segment B12 may connect corresponding first compensation segments B11 to a corresponding first signal line S1. As illustrated in FIG. 8, each first signal line S1 may extend from one end of the first signal line S1 close to the notch N, to connect one of the plurality of first compensation lines B1. In detail, each first signal lines S1 may extend from one end of the first signal line close to the notch N, to connect one corresponding second compensation segment B12.

In the display panel provided by various embodiments of the present disclosure, each of the plurality of first compensation lines may include a first compensation segment along the first direction and a second compensation segment along the second direction. Correspondingly, the plurality of first compensation lines may have multiple direction options, and the potential line corresponding to the plurality of first compensation lines may also have multiple direction options, to ensure the compensation capacitors meet the compensating requirement better.

In various embodiments, because the notch N may have different shapes, a number of the display pixels sp connected to each first signal lines S1 in the first display region AA1 may be same or different.

In one embodiment of the present disclosure illustrated in FIG. 8, each first signal line S1 may transmit the signal to a same number of the display pixels sp. Correspondingly, when an edge of the notch N adjacent to the first display region AA1 is a straight line extending along the second direction y, an overlap between one first compensation line B1 connected to each first signal line S1 and the corresponding potential line M may have a same area.

In the display panel provided by various embodiments of the present disclosure, each first signal line may transmit the signal to a same number of the display pixels, and the display pixels connected to each first signal line may generate a same capacitive load. Since an overlap between one first compensation line connected to each first signal line and the corresponding potential line may have a same area, the compensation capacitors may have a same capacitance value, a good capacitance compensation may be achieved and the display uniformity of the display panel may be improved.

In some other embodiments, the notch may have an irregular shape and each first signal line may transmit the signal to a different number of the display pixels. In one embodiment illustrated in FIG. 9, at least two first signal lines S1 may transmit the signal to different numbers of the display pixels sp. An overlap between one first compensation line connected to one first signal line S1 transmitting the signal to a larger number of the display pixels sp and the potential line may have a first area, and an overlap between another first compensation line connected to another first signal line S1 transmitting the signal to a smaller number of the display pixels sp and the potential line may have a second area. The first area may be smaller than the second area.

Figure 9:
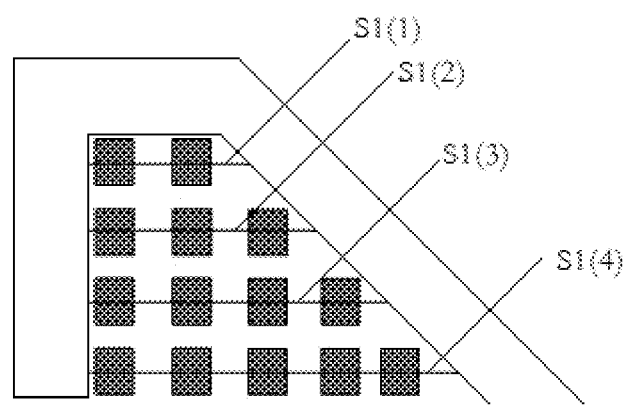
FIG. 9 illustrates a structure of an arrangement of signal lines in an exemplary display panel consistent with various disclosed embodiments in the present disclosure.

Since the notch may have an irregular shape and each first signal line may transmit the signal to a different number of the display pixels, the capacitive load on each first signal line may also be different. An overlap area between each first compensation line and the potential line may be inversely proportional to the number of the display pixels on each first signal line. Then a better capacitance compensating effect may be realized. As illustrated in FIG. 9, S1(1), S1(2), S1(3), and S1(4) denote different first signal lines S1 at different locations. S1(1), S1(2), S1(3), and S1(4) may transmit the signal to different numbers of the display pixels. Since the numbers of the display pixels connected to the first signal lines S1(1), S1(2), S1(3), and S1(4) may increase gradually, an overlap area between each first compensation line connected to one of the first signal lines S1(1), S1(2), S1(3), and S1(4), and the potential line may decrease from S1(1) to S1(4).

In the display panel provided by various embodiments of the present disclosure, an overlap between one first compensation line connected to one of the first signal lines transmitting the signal to a larger number of the display pixels and the potential line may have an area smaller than an overlap between one of other first compensation lines connected to one of other first signal lines transmitting the signal to a smaller number of the display pixels sp and the potential line. Correspondingly, when a number of the display pixels connected to each signal line is different, a good capacitance compensation may be achieved and the display uniformity of the display panel may be improved.

Figure 10:
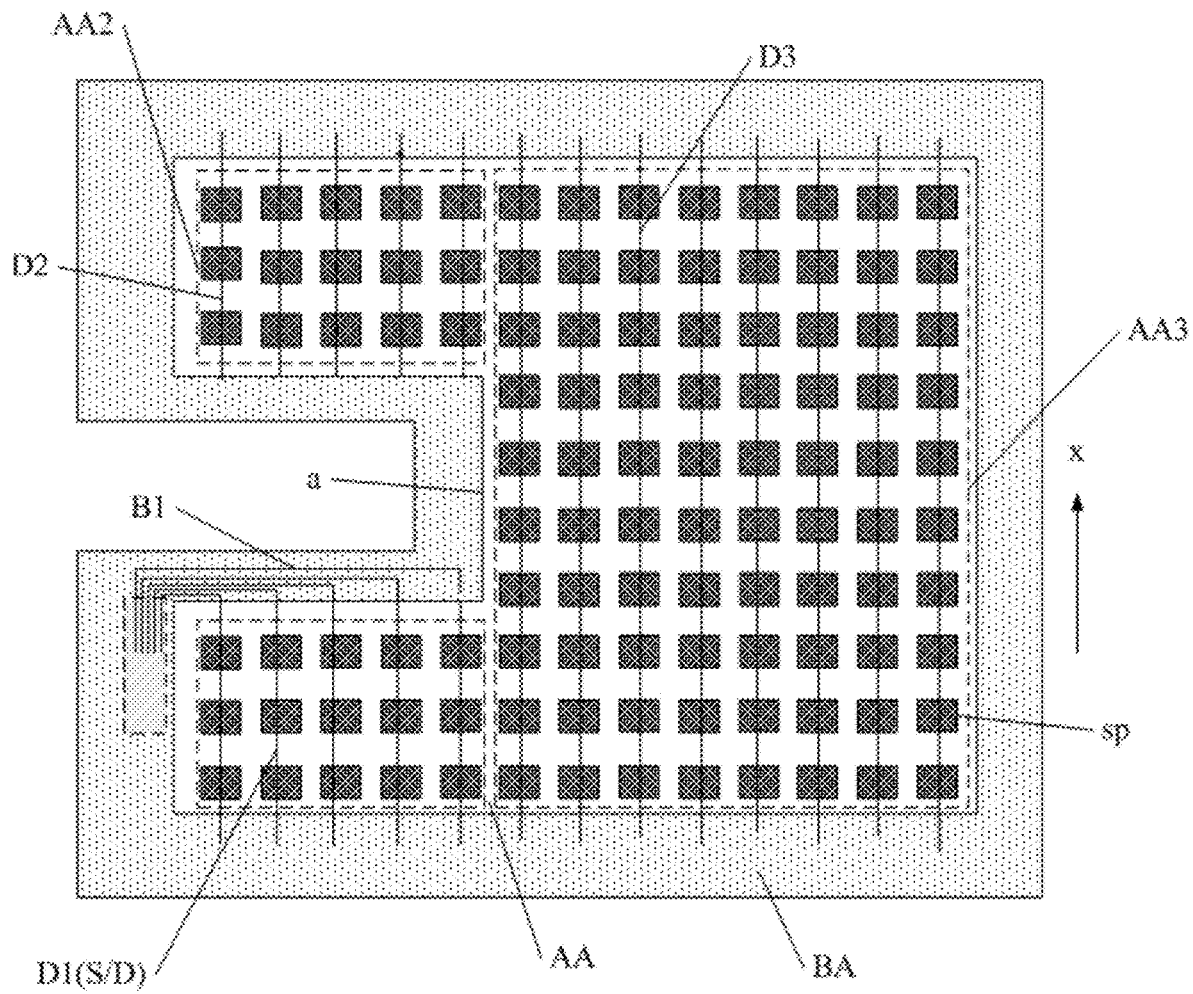
FIG. 10 illustrates another exemplary display panel consistent with various disclosed embodiments in the present disclosure.

In one embodiment of the present disclosure illustrated in FIG. 10, the signal lines S may include data lines D. The data lines D may transmit data driving signals to the display pixels sp.

As illustrated in FIG. 10, the data lines D may include first data lines D1 and second data lines D2. The first data lines D1 may provide data signals to the first plurality of display pixels sp in the first display region AA1 and the second data lines D2 may provide data signals to the second plurality of display pixels sp in the second display region AA2. The display region AA may further include a third display region AA3. The plurality of display pixels sp may further include a third plurality of display pixels sp in the third display region AA3, and the data lines D may further include third data lines D3 providing data signals to the third plurality of display pixels sp in the third display region AA3. In one embodiment illustrated in FIG. 10, the third data lines D3 may be connected with either the second data lines D2 or the first data lines D1, to simplify circuit connections. When the third data lines D3 are connected with the second data lines D2, the first data lines D1 may be not connected with the second data lines D2, and may have different capacitive loads from the capacitive loads of the second data lines D2. Correspondingly, the first display region AA1 and the second display region AA2 may display unevenly. Further, the third data lines D3 and the first data lines D1 may also have different capacitive loads, and may display unevenly. To alleviate this problem, the plurality of first compensation lines B1 connected to the first data lines D1 may be disposed in the display panel. The plurality of first compensation lines B1 may form compensation capacitors with the potential line M of the non-display region BA in different metal layers. The capacitive loads on the first data lines D1 may be compensated and the display uniformity of the display panel may be improved.

In the display panel provided by various embodiments of the present disclosure, when the plurality of signal lines includes the data lines, the data lines may transmit the data driving signals to the display pixels and the potential line may provide the fixed potential signal. The plurality of first compensation lines may be connected to the first data lines, and may overlap at least partially with the potential line in the non-display region disposed in different metal layers to form the compensation capacitors. A difference between the capacitive loads of the first signal lines and the capacitive loads of other signal lines because of the notch may be compensated, and the display uniformity of the display panel may be improved. Further, when forming the compensation capacitors, the potential line providing the fixed potential signal may be multiplexed. The width of the border of the display panel may not increase when compensating the signal lines.

Figure 11:
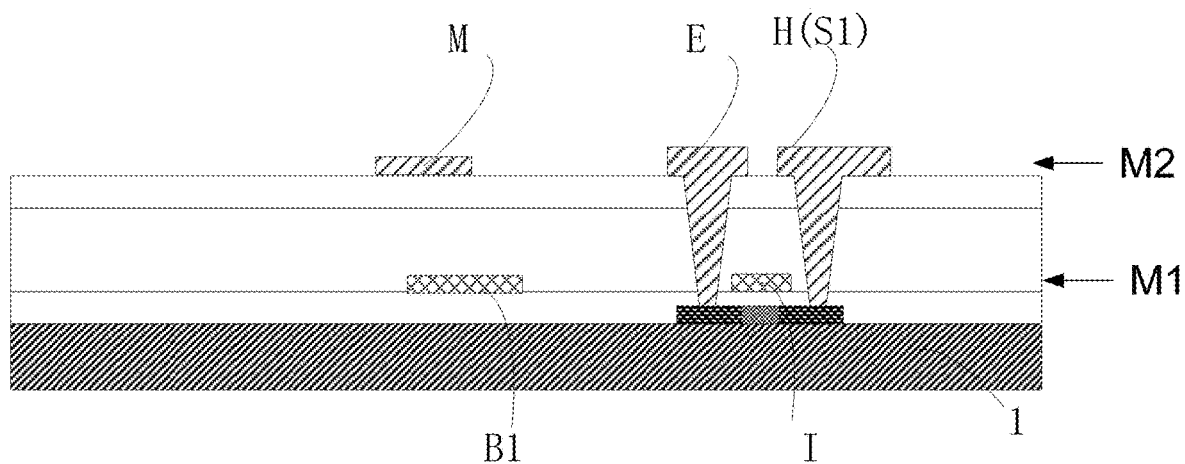
FIG. 11 illustrates another exemplary display panel consistent with various disclosed embodiments in the present disclosure.

In one embodiment of the present disclosure illustrated in FIG. 11, the display panel may include an array panel. The array panel may include a substrate panel 1 and thin film transistors disposed on the substrate panel 1. The thin film transistors may include gate electrodes I, source electrodes E and drain electrodes H. The plurality of first compensation lines B1 and the gate electrodes I may be disposed on a first metal layer M1 on one side of the substrate panel 1. The first signal lines S1 (the data lines), the potential line M, the source electrodes E and the drain electrodes H may be disposed in a second metal layer M2 on one side of the first metal layer M1 away from the substrate panel 1.

In one embodiment, the first signal lines S1 may be electrically connected to the plurality of first compensation lines B1 by a layer-changed-punched method. The plurality of first compensation lines B1 in the first metal layer M1 may overlap at least partially with the potential line M in the second metal layer M2, to form the compensation capacitors.

In the display panel provided by various embodiments of the present disclosure, the plurality of first compensation lines and the potential line may be disposed in different metal layers by a simple process, to form the compensation capacitors easily. The display uniformity of the display panel may be improved.

Figure 12:
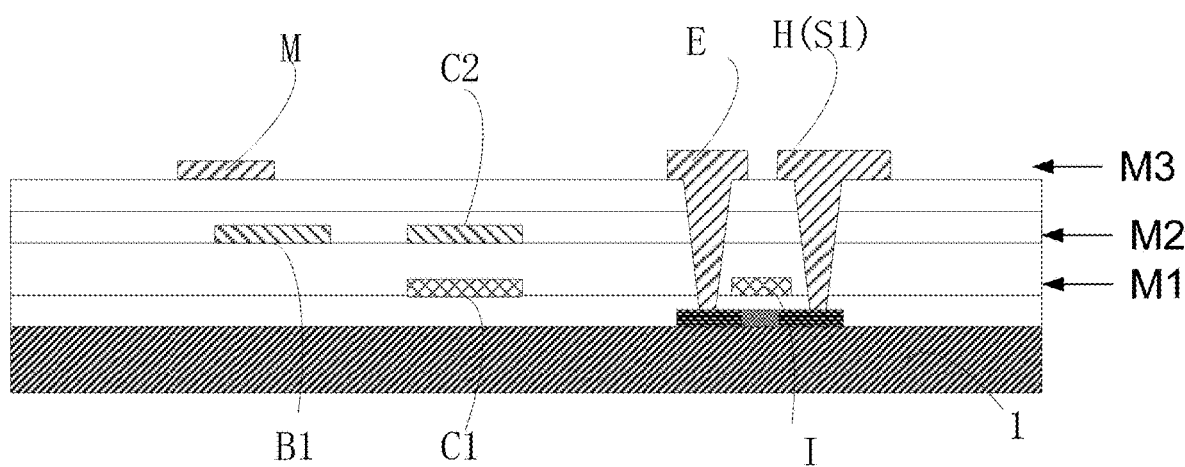
FIG. 12 illustrates another exemplary display panel consistent with various disclosed embodiments in the present disclosure.

In one embodiment of the present disclosure illustrated in FIG. 12, the display panel may include an array panel. The array panel may include a substrate panel 1, as well as thin film transistors and pixel circuit capacitors disposed in the substrate panel 1. The thin film transistors may include gate electrodes I, source electrodes E and drain electrodes H. The pixel circuit capacitors may include first electrode plates C1 and second electrode plates C2. The first electrode plates C1 and the gate electrodes I may be disposed on a first metal layer M1 on one side of the substrate panel 1. The plurality of first compensation lines B1 and the second electrode plates C2 may be disposed in a second metal layer M2 on one side of the first metal layer M1 away from the substrate panel 1. The first signal lines S1 (the data lines), the potential line M, the source electrodes E and the drain electrodes H may be disposed in a third metal layer M3 on one side of the second metal layer M2 away from the substrate panel 1.

Figure 13:
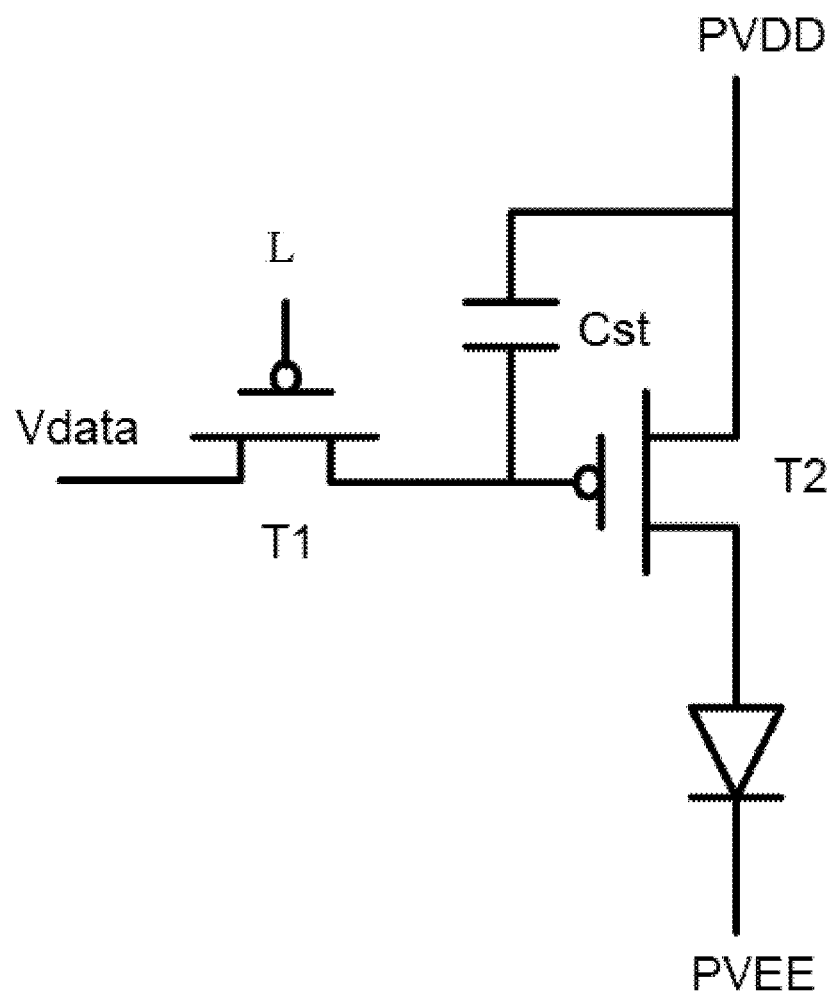
FIG. 13 illustrates a circuit connecting pixel capacitances to thin film transistors in an exemplary display panel consistent with various disclosed embodiments in the present disclosure.

In one embodiment, the plurality of first compensation lines B1 may be disposed in the second metal layer by a layer-changed-punching process. FIG. 13 illustrates a pixel circuit in an organic light-emitting display panel including the pixel circuit capacitors Cst and the thin film transistors. In FIG. 13, a thin film transistor T1 and another thin film transistor T2 may both belong to one kind of thin film transistor consistent with various embodiments of the present disclosure. L denotes the scan lines, and Vdata denotes the data lines (the first signal lines). PVDD and PVEE denote a positive power line and a negative power line respectively. For description purpose only, FIG. 13 uses one kind of pixel circuit as an example to describe the embodiments of the present disclosure, and should not limit the scope of the pixel circuit of the present disclosure. The display panel may use any kinds of the pixel circuit consistent with various embodiments of the present disclosure.

In the display panel provided by various embodiments of the present disclosure, the plurality of first compensation lines and the potential line may be disposed in different metal layers by a simple process, to form the compensation capacitors easily. The display uniformity of the display panel may be improved.

Figure 14:
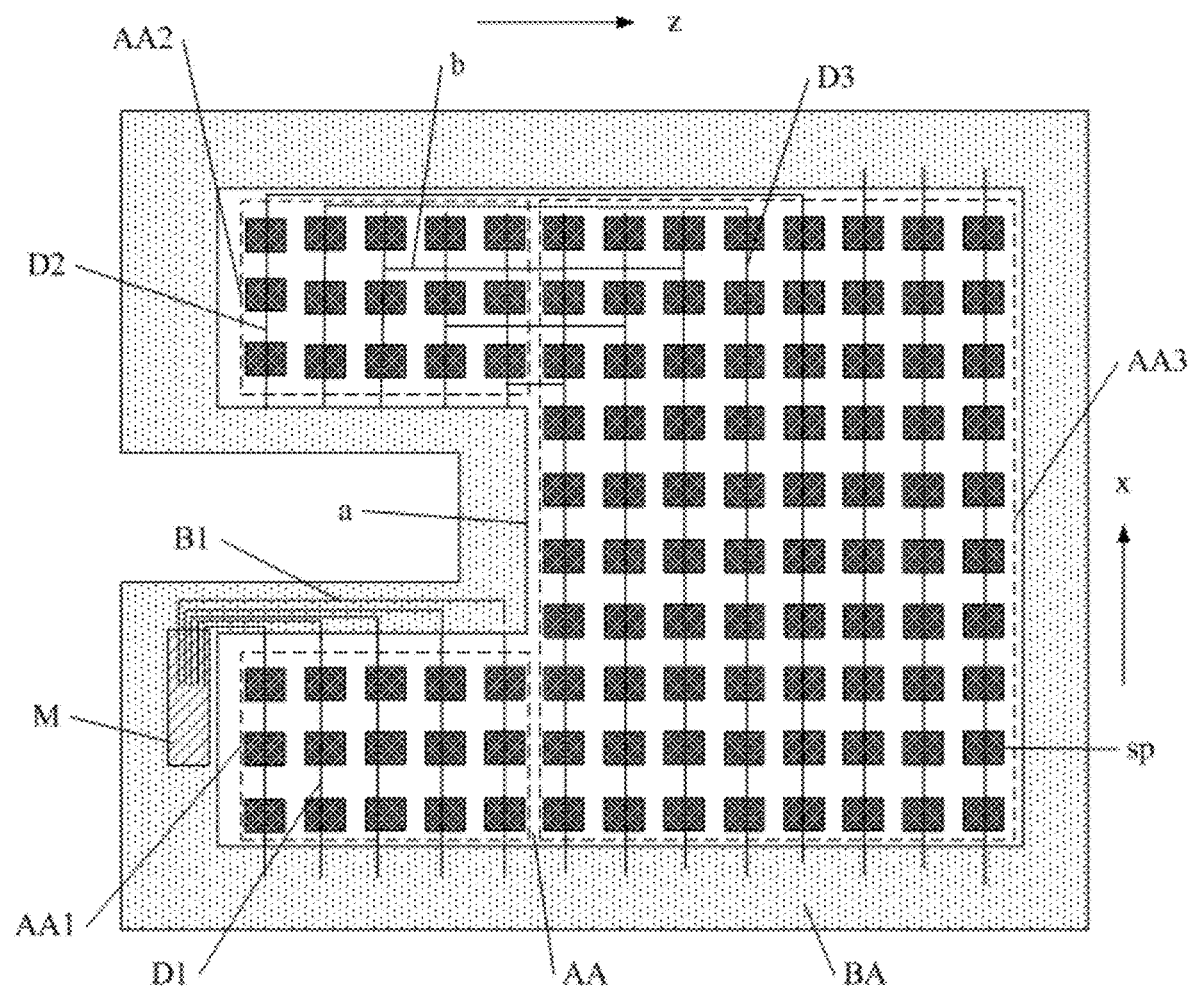
FIG. 14 illustrates another exemplary display panel consistent with various disclosed embodiments in the present disclosure.

In one embodiment of the present disclosure illustrated in FIG. 14, the signal lines may be the data lines. The display region AA may further include the third display region AA3 disposed at one side of the notch N in a third direction z where the third direction z may be perpendicular to the first direction x. The data lines may further include third data lines D3 for transmitting data driving signals to the third plurality of display pixels in the third display region. The display panel may further include a plurality of signal connection lines b. Each of the plurality of signal connection lines b may electrically connect one second data line D2 to one third data line D3.

In the display panel provided by various embodiments of the present disclosure, one second data line D2 may be electrically connected to one corresponding third data line D3 by one of the plurality of signal connection line b, and correspondingly the data signals may be transmitted to the second data lines D2 through the third data lines D3. A number of connection ports between the data lines and integrated circuit chips may be reduced, and a difference between the capacitive loads of the second data lines D2 and the capacitive loads of the third data lines D3 due to the display pixels may decrease.

In the display panel provided by various embodiments of the present disclosure, one second data line may be electrically connected to one corresponding third data line by one of the plurality of signal connection line, and correspondingly the number of the connection ports between the data lines and the integrated circuit chips may be reduced. A manufacturing cost of the display panel may decrease. Further, the capacitive loads of the second data lines and of the third data lines may be same because one second data line may be electrically connected to one corresponding third data line in the display panel. The capacitive loads of the first data lines may be compensated by the compensation capacitors, and the display uniformity of the display panel may be improved.

Figure 15:
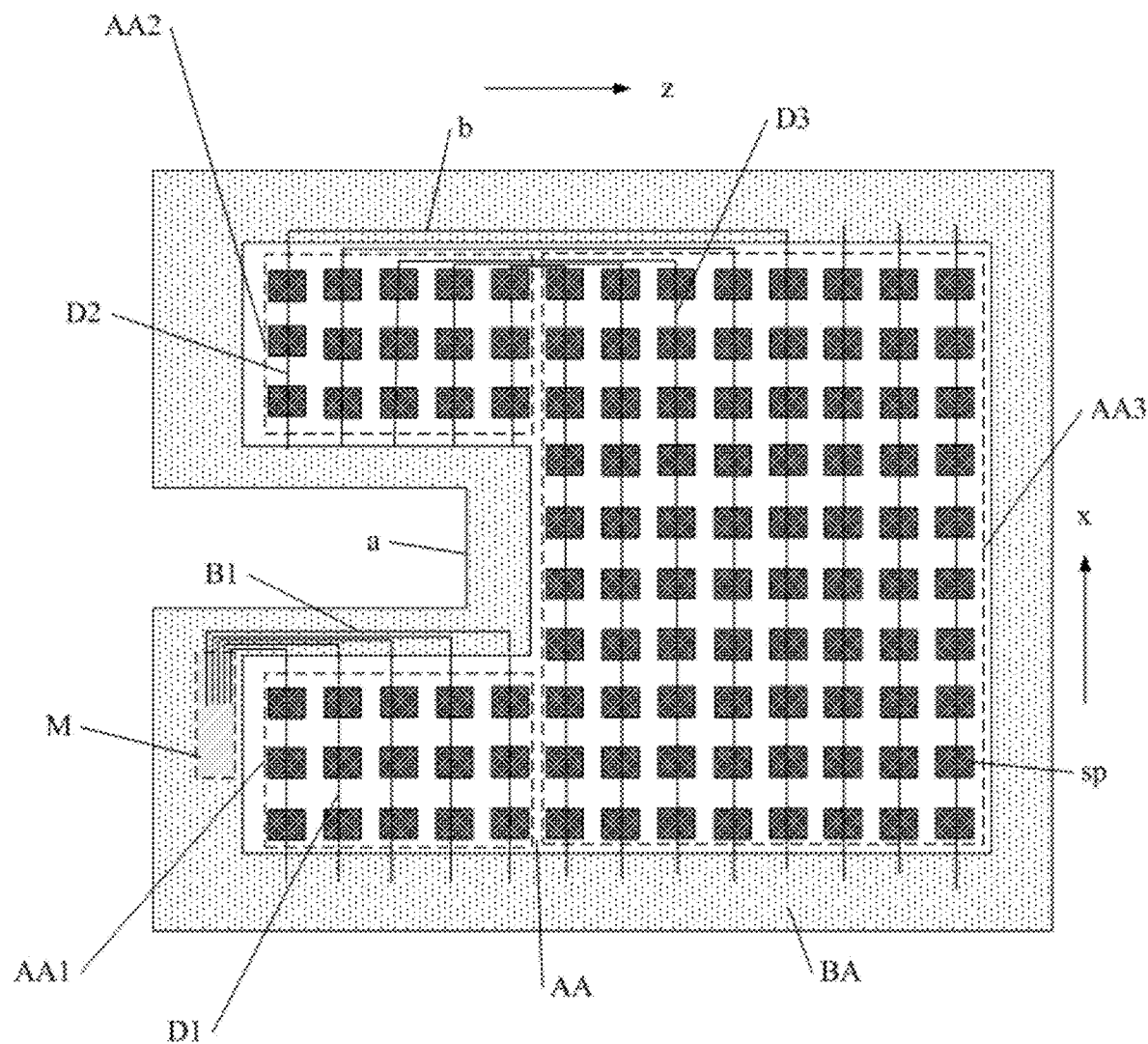
FIG. 15 illustrates another exemplary display panel consistent with various disclosed embodiments in the present disclosure.

In another embodiment of the present disclosure illustrated in FIG. 15, at least a portion of the signal connection lines b may be disposed in the non-display region BA. In various embodiments, a portion or all of the signal connection lines b may be disposed in the non-display region BA.

In the display panel provided by various embodiments of the present disclosure, at least a portion of the signal connection lines may be disposed in the non-display region. An influence on lines arrangements in the display region and on a aperture ratio may be reduced, and the display performance of the display panel may be improved.

In another embodiment of the present disclosure illustrated in FIG. 14, all of the signal connection lines b may be disposed in the display region AA, and the signal connection lines may extend into the second display region AA2 from the third display region AA3.

In the display panel provided by various embodiments of the present disclosure, all of the signal connection lines may be disposed in the display region. A number of the lines in the non-display region and then the width of the border of the display panel may be reduced.

Figure 16:
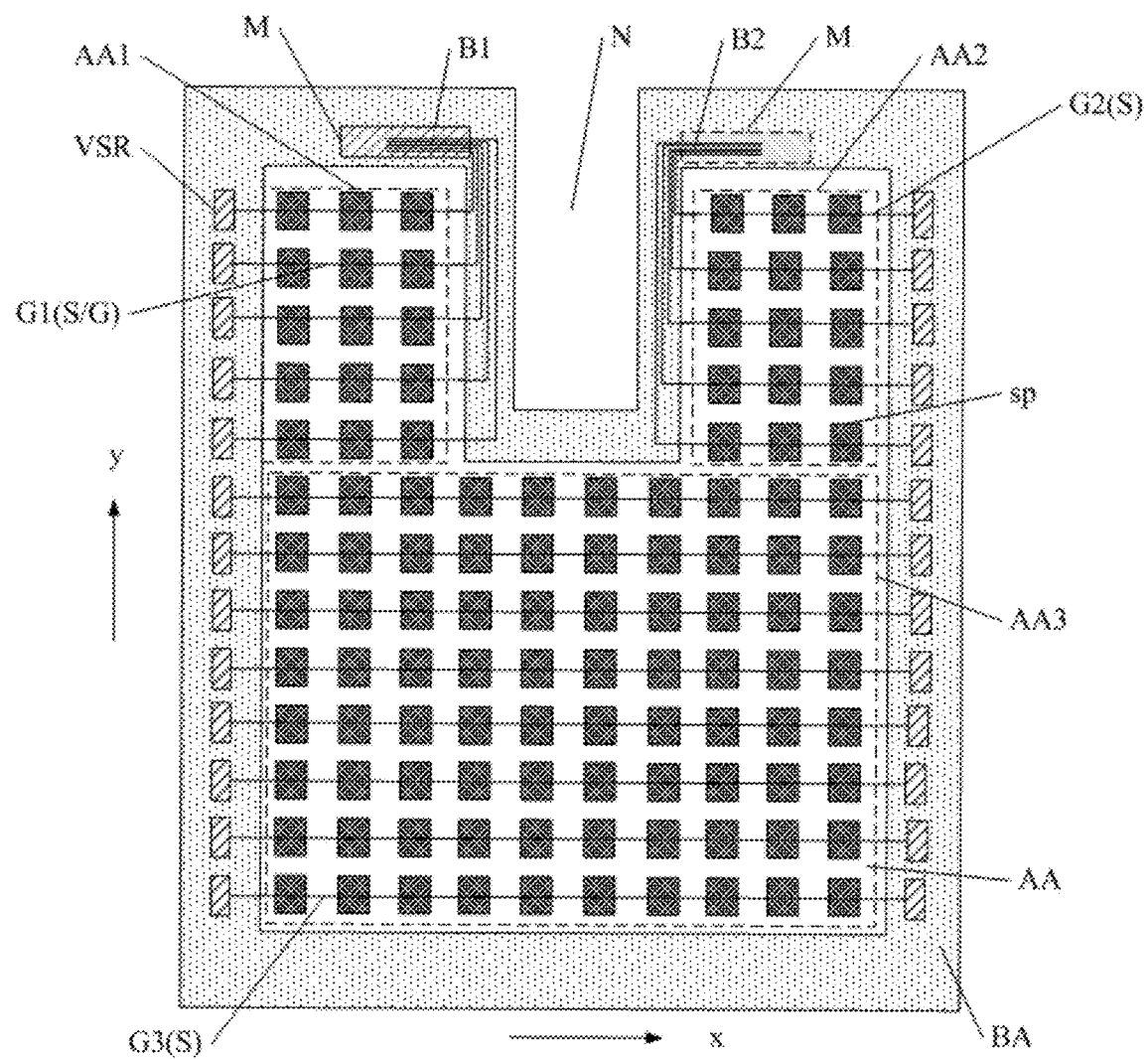
FIG. 16 illustrates another exemplary display panel consistent with various disclosed embodiments in the present disclosure.

In one embodiment of the present disclosure illustrated in FIG. 16, the signal lines S may include scan lines G transmitting the scanning driving signals to the display pixels sp. The scan lines G may include first scan lines G1 transmitting the scanning driving signals to the first plurality of display pixels sp in the first display region AA1 and second scan lines G2 transmitting the scanning driving signals to the second plurality of display pixels sp in the second display region AA2.

In the display panel, the signal lines S may include scan lines G transmitting the scanning driving signals to the display pixels sp. The display panel may further include the first compensation lines B1 electrically connected to the first scan lines G1. The first compensation lines B1 may at least partially overlap with the potential line providing the fixed potential in different metal layers, to form the compensation capacitors. A difference between the capacitive loads in the scan lines because of the notch may be compensated, and the display uniformity of the display panel may be improved. Further, the existing potential line for providing the fixed potential may be multiplexed to form the compensation capacitors, an increase in the width of the border of the display panel may be avoided when compensating the scan lines.

In another embodiment of the present disclosure, the signal lines S may include scan lines G, and the display panel may further include second compensation lines B2 in the non-display region BA, as illustrated in FIG. 16. The second compensation lines B2 may be electrically connected to the second scan lines G2, and the potential line may be disposed in a different metal layer from the second compensation lines B2. The second compensation lines G2 may at least partially overlap with the potential line, to form the compensation capacitors.

When the signal lines S include scan lines G, the first compensation lines B1 and the second compensation lines B2 may be disposed in different metal layers from the potential line. The first compensation lines B1 and the second compensation lines B2 may be disposed in a same metal layer or in different metal layers. When the first compensation lines B1 and the second compensation lines B2 are disposed in different metal layers, an influence on a wiring configuration in the notch may be reduced. To further reduce the influence on an arrangement of lines in the notch, the scanning driving circuit may be disposed at one side of the non-display region BA away from the notch. For each first scan line G1, one end close to the notch may be extended to be connected with one first compensation line B1, and another end may be connected to the scanning driving circuit VSR. For each second scan line G2, one end close to the notch may be extended to be connected with one second compensation line B2, and another end may be connected to the scanning driving circuit VSR.

In the display panel provided by various embodiments of the present disclosure, the signal lines may include the scan lines. The first compensation lines may be connected to the first scan lines, and may form the compensation capacitors for the first scan lines with the potential line. The second compensation lines may be connected to the second scan lines, and may form the compensation capacitors for the second scan lines with the potential line. The display uniformity of the display panel may be improved.

Figure 17:
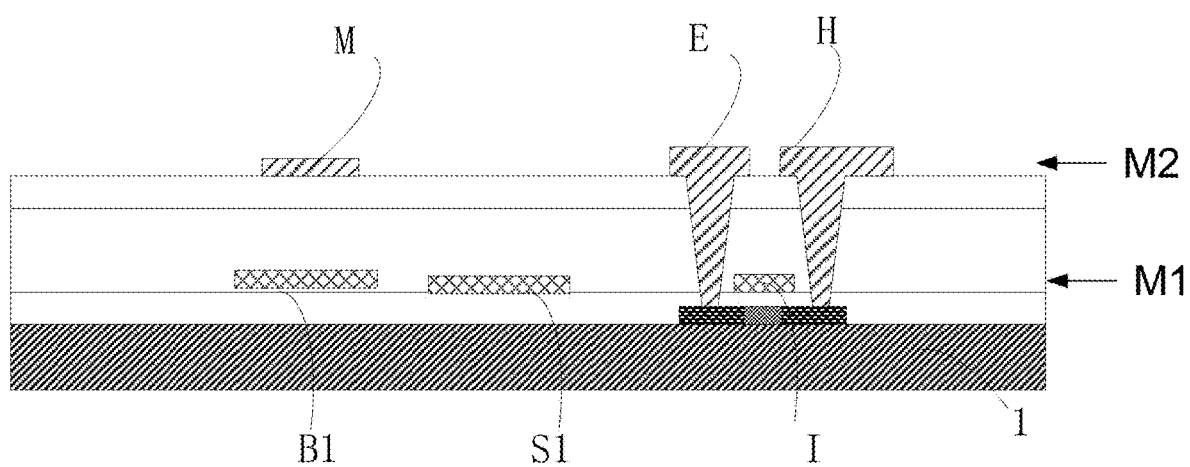
FIG. 17 illustrates another exemplary display panel consistent with various disclosed embodiments in the present disclosure.

In another embodiment of the present disclosure illustrated in FIG. 17, the signal lines may include the scan lines, and the display panel may include the array panel. The array panel may include the substrate panel 1 and the thin film transistors disposed on the substrate panel 1. The thin film transistors may include gate electrodes I, source electrodes E and drain electrodes H. The first compensation lines B1, the first signal lines (the first scan lines) S1, and the gate electrodes I may be disposed on a first metal layer M1 on one side of the substrate panel 1. The potential line M, the source electrodes E and the drain electrodes H may be disposed in a second metal layer M2 on one side of the first metal layer M1 away from the substrate panel 1.

In the display panel provided by various embodiments of the present disclosure, the first scan lines may extend into the non-display region to form the compensation lines by a simple process. Further, the first scan lines and the potential line providing the fixed potential may be disposed in different metal layers. The compensation capacitors may be formed easily and the display uniformity of the display panel may be improved.

Figure 18:
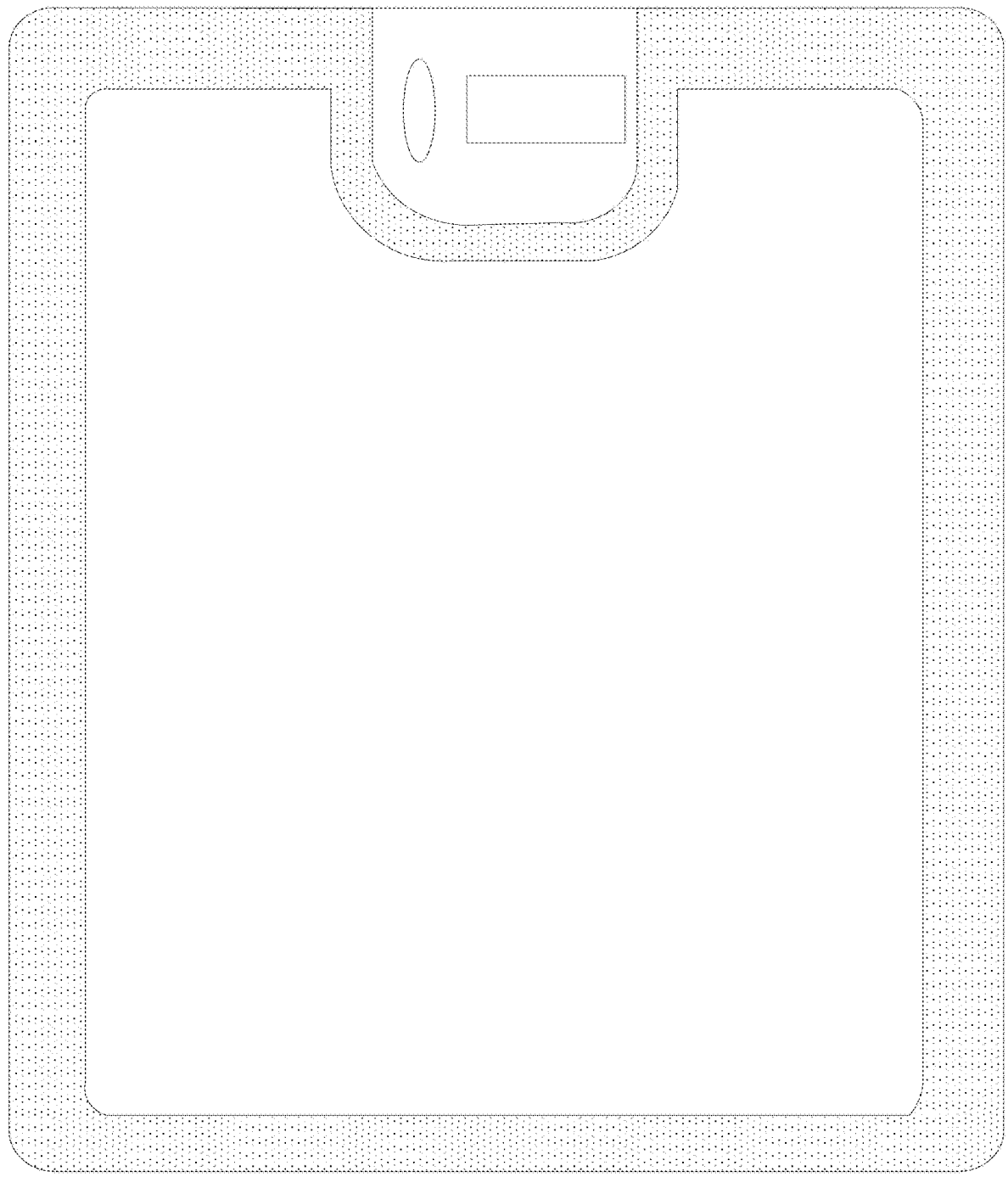
FIG. 18 illustrates an exemplary display device consistent with various disclosed embodiments in the present disclosure.

The present disclosure provides a display device. FIG. 18 illustrates a display device consistent with various embodiments of the present disclosure. The display device may include a display panel provided by any embodiment of the present disclosure.

In the display panel and the display device provided by various embodiments of the present disclosure, the first compensation lines and the potential lines in the non-display region may be disposed in different metal layers, and may at least partially overlap with each other to form the compensation capacitors. The first compensation lines may be electrically connected to the first signal lines, and the display uniformity of the display panel may be improved. When forming the compensation capacitors, the existing potential line providing the fixed potential may be multiplexed. An increase of the width of the border of the display panel may be avoided when compensating the signal lines. The first compensation lines and the potential lines in the non-display region may be disposed in different metal layers. Correspondingly, the compensation capacitors formed between the first compensation lines and the potential line may not occupy the border of the display panel. The display panel with the narrow border may be achieved.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
a display region having a first edge;
a non-display region surrounding the display region;
a plurality of display pixels including a first and second plurality of display pixels, in the display region;
a plurality of signal lines for transmitting driving signals to the plurality of display pixels;
a plurality of first compensation lines in the non-display region; and
a potential line in the non-display region for providing a fixed potential;
wherein:
the plurality of signal lines and the first edge of the display region extend along a first direction;
the first edge recesses toward an inside of the display region to form a notch;
the display region includes a first display region and a second display region separated by the notch along the first direction;
the plurality of signal lines includes first signal lines for transmitting the driving signals to the first plurality of display pixels in the first display region and second signal lines for transmitting the driving signals to the second plurality of display pixels in the second display region;
the first signal lines are not electrically connected to the second signal lines;
the plurality of first compensation lines is electrically connected to the first signal lines;
the potential line and the plurality of first compensation lines are disposed in different metal layers respectively; and
each of the plurality of first compensation lines at least partially overlaps with the potential line to form a compensation capacitor.

2. The display panel according to claim 1, wherein:
the potential line is a negative power line for transmitting negative power signals to the plurality of display pixels.

3. The display panel according to claim 2, wherein:
the non-display region further includes:
a scanning driving circuit providing scanning driving signals to drive the plurality of display pixels; and
a package metal on one side of the scanning driving circuit away from the display region, wherein the package metal is multiplexed as the negative power line.

4. The display panel according to claim 2, wherein:
the non-display region further includes:

a scanning driving circuit providing scanning driving signals to drive the plurality of display pixels, wherein the scanning driving circuit is disposed between the negative power line and the display region; and
a package metal, wherein the package metal and the negative power line are disposed in different metal layers.

5. The display panel according to claim 1, wherein:
the non-display region further includes a scanning driving circuit providing scanning driving signals to drive the plurality of display pixels; and
the potential line is a low potential signal line providing a fixed low potential to the scanning driving circuit.

6. The display panel according to claim 5, wherein:
the potential line extends along the first direction; and
a width of the potential line along a second direction perpendicular to the first direction is larger than or equal to 50 μm.

7. The display panel according to claim 1, wherein:
the non-display region includes a first non-display region extending along the first direction and adjacent to the first display region; and
each of the plurality of first compensation lines at least overlaps with the potential line in the first non-display region, to form a compensation capacitor.

8. The display panel according to claim 7, wherein:
each of the plurality of first compensation lines includes a first compensation segment extending along the first direction and a second compensation segment extending along a second direction perpendicular to the first direction; and
the second compensation segment is used to connect the first compensation segment and one corresponding first signal line.

9. The display panel according to claim 1, wherein:
each first signal line transmits signals to a same number of display pixels; and
an overlap part between each of the plurality of first compensation lines connected to the first signal lines and the potential line has a same area.

10. The display panel according to claim 1, wherein:
at least two of the first signal lines transmits signals to different numbers of display pixels;
an overlap part between one first compensation line in a portion of the plurality of first compensation lines connected to the first signal lines transmitting signals to a larger number of display pixels and the potential line has a first area;
an overlap part between one first compensation line in another portion of the plurality of first compensation lines connected to the first signal lines transmitting signals to a smaller number of display pixels and the potential line has a second area;
the first area is less than the second area.

11. The display panel according to claim 1, wherein the plurality of signal lines include data lines transmitting data driving signals to the plurality of the display pixels.

12. The display panel according to claim 11, further including:
an array panel having a substrate panel and thin film transistors formed on the substrate panel;
wherein:
the thin film transistors include gate electrodes, source electrodes and drain electrodes;

the plurality of the first compensation lines and the gate electrodes are disposed in a first metal layer on one side of the substrate panel; and the first signal lines, the potential line, the source electrodes, and the drain electrodes are disposed in a second metal layer on one side of the first metal layer away from the substrate panel.

13. The display panel according to claim 11, further including an array panel, wherein:
the array panel includes a substrate panel, thin film transistors and pixel circuit capacitors formed on the substrate panel;
the thin film transistors include gate electrodes, source electrodes and drain electrodes;
the pixel circuit capacitors include first electrode panels and second electrode panels;
the first electrode panels and the gate electrodes are disposed in a first metal layer on one side of the substrate panel;
the plurality of first compensation lines and the second electrode panels are disposed in a second metal layer on one side of the first metal layer away from the substrate panel; and
the first signal lines, the potential line, the source electrodes, and the drain electrodes are disposed in a third metal layer on one side of the second metal layer away from the substrate panel.

14. The display panel according to claim 11, wherein:
the display region further includes a third display region at one side of the notch along a third direction perpendicular to the first direction;
the plurality of display pixels further includes a third plurality of display pixels in the third display region;
the plurality of signal lines further includes third signal lines transmitting the driving signals to the third plurality of display pixels in the third display region;
the display panel further includes a plurality of signal connection lines;
one of the plurality of signal connection lines is used to connect one second signal lines with one third signal lines.

15. The display panel according to claim 14, wherein:
at least a portion of the plurality of signal connection lines is disposed in the non-display region.

16. The display panel according to claim 14, wherein:
all of the plurality of signal connection lines are disposed in the display region and extend into the second display region from the third display region.

17. The display panel according to claim 1, wherein:
the signal lines include scanning lines transmitting scanning driving signals to the plurality of display pixels.

18. The display panel according to claim 17, further including:
a plurality of second compensation lines in the non-display region and electrically connected to the second signal lines;
wherein:

the potential line and the plurality of second compensation lines are disposed in different metal layers; and
each of the plurality of second compensation lines at least partially overlaps with the potential line, to form a compensation capacitor.

19. The display panel according to claim 17, further including an array panel, wherein:
the array panel includes a substrate panel and thin film transistors formed on the substrate panel;
the thin film transistors include gate electrodes, source electrodes and drain electrodes;
the plurality of the first compensation lines, the first signal lines, and the gate electrodes are disposed in a first metal layer on one side of the substrate panel; and
the potential line, the source electrodes, and the drain electrodes are disposed in a second metal layer on one side of the first metal layer away from the substrate panel.

20. A display device, comprising:
a display panel, comprising:
a display region having a first edge;
a non-display region surrounding the display region;
a plurality of display pixels including a first and second plurality of display pixels, in the display region;
a plurality of signal lines for transmitting driving signals to the plurality of display pixels;
a plurality of first compensation lines in the non-display region; and
a potential line in the non-display region for providing a fixed potential;
wherein:
the plurality of signal lines and the first edge of the display region extend along a first direction;
the first edge recesses toward an inside of the display region to form a notch;
the display region includes a first display region and a second display region separated by the notch along the first direction;
the plurality of signal lines includes first signal lines for transmitting the driving signals to the first plurality of display pixels in the first display region and second signal lines for transmitting the driving signals to the second plurality of display pixels in the second display region;
the first signal lines are not electrically connected to the second signal lines;
the plurality of first compensation lines is electrically connected to the first signal lines;
the potential line and the plurality of first compensation lines are disposed in different metal layers respectively; and
each of the plurality of first compensation lines at least partially overlaps with the potential line to form a compensation capacitor.

* * * * *